(12) United States Patent
Lee et al.

(10) Patent No.: US 9,107,329 B2
(45) Date of Patent: Aug. 11, 2015

(54) METHOD FOR MANUFACTURING PRINTED CIRCUIT BOARD

(75) Inventors: Chang Bo Lee, Busan (KR); Dae Jo Hong, Gyunggi-do (KR); Cheol Ho Choi, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 661 days.

(21) Appl. No.: 13/232,220

(22) Filed: Sep. 14, 2011

(65) Prior Publication Data
US 2012/0285924 A1    Nov. 15, 2012

(30) Foreign Application Priority Data

May 11, 2011    (KR) ................ 10-2011-0043958
Jul. 4, 2011     (KR) ................ 10-2011-0066091

(51) Int. Cl.
*H05K 3/00* (2006.01)
*H05K 3/24* (2006.01)
*H05K 3/34* (2006.01)
*H01L 23/00* (2006.01)

(52) U.S. Cl.
CPC .............. *H05K 3/243* (2013.01); *H05K 3/3452* (2013.01); *H01L 24/13* (2013.01); *H01L 24/16* (2013.01); *H01L 24/45* (2013.01); *H01L 24/48* (2013.01); *H01L 2224/131* (2013.01); *H01L 2224/16225* (2013.01); *H01L 2224/45139* (2013.01); *H01L 2224/45144* (2013.01); *H01L 2224/45147* (2013.01); *H01L 2224/48227* (2013.01); *H01L 2924/01013* (2013.01); *H01L 2924/01028* (2013.01); *H01L 2924/01047* (2013.01); *H05K 2203/1383* (2013.01); *Y10T 29/49147* (2015.01)

(58) Field of Classification Search
CPC .............. H05K 3/243; H05K 3/3452; H05K 2203/1383; H01L 24/13; H01L 24/16; H01L 24/45; H01L 24/48; H01L 2924/01013; H01L 2224/131; H01L 2224/16225; H01L 2224/45139; H01L 2224/45144; H01L 2224/45147; H01L 2224/48227; H01L 2924/01047; H01L 2924/01028; H01L 2924/00014; H01L 2924/014; H01L 2924/00; Y10T 29/49147; Y10T 29/49124; Y10T 29/49117; Y10T 29/49002
USPC ........ 29/842, 829, 825, 592.1, 830, 832, 840, 29/846; 427/96.1, 96.2, 96.3, 97.1, 98.6, 427/99.2, 99.1, 99.4, 98.2; 205/125, 122, 205/118, 80; 216/13
See application file for complete search history.

(56) References Cited

U.S. PATENT DOCUMENTS

| | | | |
|---|---|---|---|
| 7,183,203 B2* | 2/2007 | Uozumi | 438/653 |
| 7,948,085 B2* | 5/2011 | Shih et al. | 257/758 |
| 8,399,801 B2* | 3/2013 | Oh et al. | 219/121.72 |
| 8,686,300 B2* | 4/2014 | Kawai et al. | 174/262 |
| 2012/0030938 A1* | 2/2012 | Park et al. | 29/829 |

* cited by examiner

*Primary Examiner* — Peter DungBa Vo
*Assistant Examiner* — Azm Parvez
(74) *Attorney, Agent, or Firm* — Ladas & Parry, LLP

(57) ABSTRACT

Disclosed herein is a method for manufacturing a printed circuit board. The method for manufacturing a printed circuit board includes: preparing a base substrate having first connection pads and second connection pads; forming a solder resist layer on the base substrate, the solder resist layer having a first opening for exposing the first connection pads; forming a first surface treatment layer on the first connection pads; forming a protective film on the solder resist layer; forming a second opening for exposing the second connection pads in the protective film and the solder resist layer; and forming a second surface treatment layer on the second connection pads.

15 Claims, 7 Drawing Sheets

METHOD FOR MANUFACTURING PRINTED CIRCUIT BOARD

CROSS REFERENCE TO RELATED APPLICATION

This application claims the benefit of Korean Patent Application Nos. 10-2011-0043958, filed on May 11, 2011, and 10-2011-0066091, filed on Jul. 4, 2011, entitled "Method for Manufacturing Printed Circuit Board", which is hereby incorporated by reference in its entirety into this application.

BACKGROUND OF THE INVENTION

1. Technical Field

The present invention relates to a method for manufacturing a printed circuit board.

2. Description of the Related Art

Since a semiconductor package substrate has high integration and high speed by degrees and a connecting type thereof with semiconductor is developing from the existing wire bonding type to a flip chip bonding type, a demand that different kinds of surface treatments are applied to a single printed circuit board is increasing.

In a method for manufacturing a printed circuit board according to the prior art, a process for application of different kinds of surface treatments is as follows.

First, an outer layer circuit is formed on an upper surface of a substrate having an inner layer circuit.

Here, the outer layer circuit may include wire bonding pads for connecting a semiconductor chip or the like to the substrate by using wires of gold (Au), silver (Ag), copper (Cu), or the like, bump pads for connecting another semiconductor chip or the like to the substrate by using solder bumps or the like, that is, for flip-chip connection, and circuit patterns.

The outer layer circuit may be generally formed in the following process sequence.

First, an insulating layer is formed on the upper surface of the substrate having the inner layer circuit, and a via hole is formed in the insulating layer. The result substrate is subjected to electroless plating, thereby forming a seed layer.

Next, a plating resist is formed on the insulating layer on which the seed layer is formed, and then, a patterned mask is disposed above an upper surface of the plating resist. Then, an opening for forming the outer layer circuit is formed in the plating resist by carrying out exposing and developing processes, and a plating layer is formed by carrying out electroplating.

After the outer layer circuit is formed through the above-described processes, a plating resist having an opening for exposing the wired bonding pads is formed on the insulating layer on which the outer layer circuit is formed. A first surface treatment layer is formed by performing electroplating on the wire bonding pads, and then the plating resist is removed.

A solder resist layer having openings for respectively exposing the wire bonding pads and the bump pads is formed, and then a second surface treatment layer is formed on the bump pads by using an organic solderability preservative OSP type.

However, this method according to the prior art includes two processes of forming and removing the plating resist for forming the outer layer circuit and the first surface treatment layer and a process of forming a solder resist layer, and thus, the number of processes is increased and the processing time is longer, thereby lowering the processing efficiency.

SUMMARY OF THE INVENTION

The present invention has been made in an effort to provide a method for manufacturing a printed circuit board capable of improving the processing efficiency by decreasing the number of processes to shorten the processing time.

Further, the present invention has been made in an effort to provide a method for manufacturing a printed circuit board capable of easily performing various kinds of surface treatment processes.

Further, the present invention has been made in an effort to provide a method for manufacturing a printed circuit board capable of preventing circuit patterns from being damaged by decreasing the number of etching processes.

Further, the present invention has been made in an effort to provide a method for manufacturing a printed circuit board capable of preventing a whitening phenomenon generated on a surface of the solder resist layer.

According to a preferred embodiment of the present invention, there is provided a method for manufacturing a printed circuit board including: preparing a base substrate having first connection pads and second connection pads; forming a solder resist layer on the base substrate, the solder resist layer having a first opening for exposing the first connection pads; forming a first surface treatment layer on the first connection pads; forming a protective film on the solder resist layer; forming a second opening for exposing the second connection pads in the protective film and the solder resist layer; and forming a second surface treatment layer on the second connection pads.

The forming of the solder resist layer may include: forming the solder resist layer on the base substrate; disposing a mask, which has a pattern for exposing the first connection pads, above an upper surface of the solder resist layer; and removing a part of the solder resist, which corresponds to the first connection pads, through exposing and developing processes.

The forming of the second opening may include disposing a mask, which has a pattern for exposing the second connection pads, above an upper surface of the protective film; and removing parts of the protective film and the solder resist, which correspond to the second connection pads, by using laser.

The laser may include at least one of $CO_2$ laser, excimer laser, and YAG laser.

The method may further include performing post-treatment for removing residues due to the laser processing is performed after the removing of the protective film and the solder resist.

The post-treatment may be performed by wet desmear treatment or dry desmear treatment The method may further include removing the protective film after the performing of the post-treatment.

The first connection pad may be a wire bonding pad and the second connection pad may be a bump pad.

The first surface treatment layer and the second surface treatment layer may be formed, respectively, by at least one of an electrolytic nickel and gold plating type, an electroless nickel immersion gold (ENIG) type, an electroless nickel autocatalytic gold (ENAG) type, an electroless nickel electroless palladium immersion gold (ENEPIG) type, an electroless nickel immersion palladium immersion gold (ENPIG) type, an immersion tin plating type, and an organic solderability preservative (OSP) type.

The first surface treatment layer and the second surface treatment layer may be respectively formed in different types.

The first surface treatment layer may be formed by any one of the electrolytic nickel and gold plating type, the ENIG type, the ENAG type, the ENEPIG type, the ENPIG type, and the immersion tin plating type, and the second surface treatment layer is formed by the OSP type.

The method may further include removing the protective film after the forming of the second surface treatment layer.

The protective film may be a PET film or a polyimide (PI) film.

The second opening may be formed in a tapered shape.

An unevenness may be formed on a sidewall of the solder resist layer inside the second opening.

The sidewall of the solder resist layer inside the second opening may have a higher roughness than an inner sidewall of the first opening.

The sidewall of the solder resist layer inside the second opening may have a higher brightness than the inner sidewall of the first opening.

DESCRIPTION OF THE PREFERRED EMBODIMENTS

Figure 1:
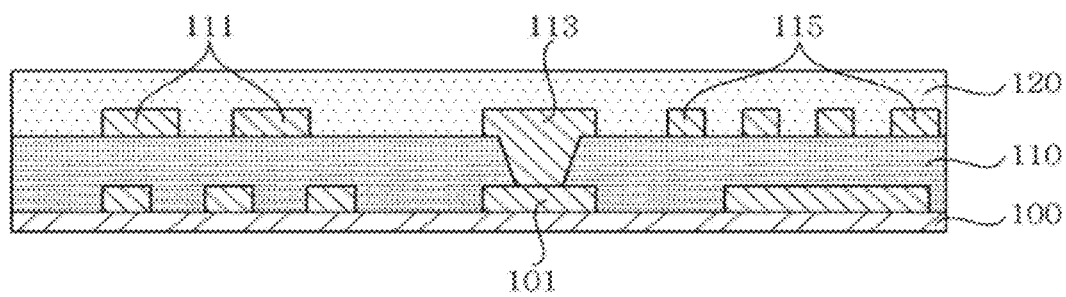
FIGS. 1 to 8 are cross-sectional views sequentially showing processes of a method for manufacturing a printed circuit board according to a preferred embodiment of the present invention.

Various objects, advantages and features of the invention will become apparent from the following description of preferred embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention.

Various objects, advantages and features of the invention will become apparent from the following description of embodiments with reference to the accompanying drawings. In the specification, in adding reference numerals to components throughout the drawings, it is to be noted that like reference numerals designate like components even though components are shown in different drawings. Further, when it is determined that the detailed description of the known art related to the present invention may obscure the gist of the present invention, the detailed description thereof will be omitted. In the description, the terms "first", "second", and so on are used to distinguish one component from another component, and the components are not limited by the above terms.

Hereinafter, preferred embodiments of the present invention will be described in detail with reference to the accompanying drawings.

FIGS. 1 to 8 are cross-sectional views showing processes of a method for manufacturing a printed circuit board according to a preferred embodiment of the present invention.

Although the figures are schematically drawn such that other detailed components of the printed circuit board except characteristic parts of a corresponding preferred embodiment are omitted, those skilled in the art would recognize that the manufacturing method according to the present invention can be applied to all the printed circuit board known to the art without particular limitation.

Hereinafter, the present invention will be described in more detail with reference to the following preferred embodiment, but is not limited thereto.

First, as shown in FIG. 1, a solder resist layer 120 is formed on an insulating layer 110 on which an outer layer circuit is formed.

The outer layer circuit may include first connection pads 111, second connection pads 113, and circuit patterns 115.

For example, the first connection pads 111 are wire bonding pads for connecting a semiconductor chip or the like to a base substrate by using wires of gold (Au), silver (Ag), copper (Cu), or the like, and the second connection pads 113 are bump pads for connecting another semiconductor chip or the like to the base substrate by using solder bumps or the like, that is, for flip-chip connection.

However, the first connection pads 111 and the second connection pads 113 are not limited thereto, and they may be a part of circuit patterns or pads for surface mount.

A resin insulation layer may be used as the insulating layer 110. A thermosetting resin such as an epoxy resin, a thermoplastic resin such as polyimide, or a resin where a reinforcing agent such as a glass fiber or an inorganic filler is impregnated with the thermosetting resin and/or the thermoplastic resin, for example, a prepreg, may be used for the resin insulation layer, and also, a photocurable resin or the like may be used. However, the resin insulation layer is not limited thereto.

In addition, the insulating layer 110 may be formed on a substrate 100 having an inner layer circuit 101 formed thereon. Hereinafter, the substrate 100 having the inner layer circuit 101 together with the insulating layer will be referred to as the base substrate.

Although the inner layer circuit 101 is described to be formed on one surface of the substrate 100 in the present preferred embodiment, it may be formed on both surfaces of the substrate 100 and the inner layer circuit 101 may not be formed.

Although the insulating layer 110 and the outer layer circuit including the first connection pads 111, the second connection pads 113, and the circuit patterns 115 are described to be formed on one surface of the substrate 100, they may also be formed on both surfaces of the substrate 100, as well.

Here, the substrate 100 may be a multi-layer printed circuit board formed by stacking a plurality of insulating layers and a plurality of circuit layers. The base substrate may also be a double-sided printed circuit substrate without the insulating layer 110.

Figure 2:
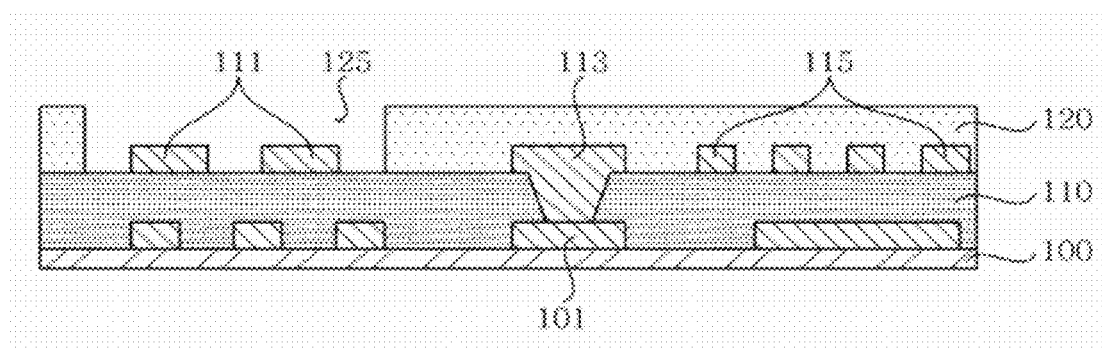

Then, as shown in FIG. 2, a first opening 125 is formed in the solder resist layer 120 to expose the first connection pads 111.

Here, the first opening 125 may be formed by using a photolithography method including exposing and developing processes.

More specifically, first, the solder resist layer 120 is formed on the insulating layer 110 of the base substrate to cover the first connection pads 111, the second connection pads 113, and circuit patterns 115, like in the above-described process. A mask having a pattern for exposing the first connection pads 111 is disposed above an upper surface of the solder resist layer 120, followed by exposing and developing processes, thereby removing a part of solder resist corresponding to the first connection pads 111. As a result, the first opening 125 is formed.

As such, the first opening 125 is formed by the photolithography method to expose only the first connection pads 111 to the outside. In this case, a first surface treatment layer 111a can be formed on only the first connection pads 111 by a desired surface treatment type, even without a separate plating resist for covering the second connection pads 113.

In the prior art, which is different from the present preferred embodiment, the second connection pads 113 have to be covered with a plating resist in order to form a first surface treatment layer 111a on only the first connection pads 111 after the first connection pads 111 and the second connection pads 113 are all exposed. However, there were problems in that the plating resist cannot endure a plating liquid and there is a problem in that the number of processes is increased and thus, the processing time is longer, at the time when electroless plating is applied.

However, according to the preferred embodiment, only the first surface treatment layer 111a can be formed by electroless plating, without using the plating resist itself, and thus, the manufacturing process can be shortened, thereby reducing the processing cost and the processing time, as compared with electroplating.

Moreover, plating leadlines for electroplating are not required, and thus the degree of freedom in circuit design can be improved and generation of noise or the like due to remaining plating leadlines can be prevented. Moreover, an etching process for removing plating leadlines is not required, and thus damages of the circuit patterns due to the etching process can be prevented.

Figure 3:
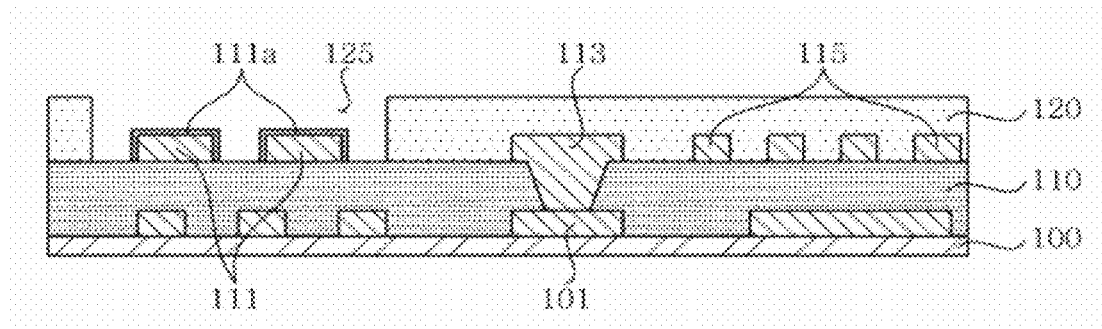

Then, as shown in FIG. 3, the first surface treatment layer 111a is formed on the first connection pads 111 within the first opening 125.

According to the above-described process, the first connection pads 111 is exposed to the outside through the first opening 125 while the second connection pads 113 are still covered with the solder resist layer 120. Therefore, at the time when electroless plating is applied, the solder resist layer 120 functions as a plating resist, and the first surface treatment layer 111a of, for example, nickel or gold, may be formed on only the first connection pads 111.

As such, in the present preferred embodiment, the solder resist layer 120 can function as a plating resist temporarily, and thus, a separate plating resist is not required. As a result, an electroless plating process for selectively surface-treating only the first connection pads 111 can be easily and effectively performed.

Here, any one of an electrolytic nickel and gold plating type, an electroless nickel immersion gold (ENIG) type, an electroless nickel autocatalytic gold (ENAG) type, an electroless nickel electroless palladium immersion gold (ENEPIG) type, an electroless nickel immersion palladium immersion gold (ENPIG) type, an immersion tin plating type, and an organic solderability preservative (OSP) type may be used in forming the first surface treatment layer 111a. The present invention uses an electroless plating type, but is not particularly limited thereto.

Figure 4:
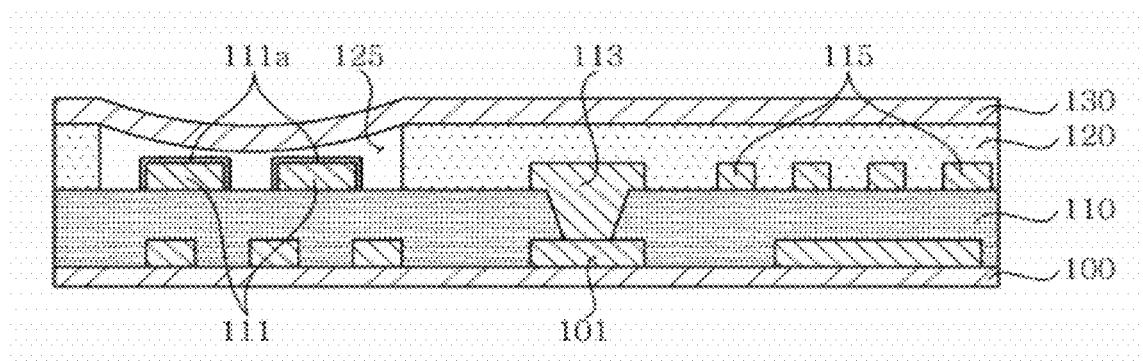

Then, as shown in FIG. 4, a protective film 130 is formed on the solder resist layer 120 including the first opening 125.

Figure 5:
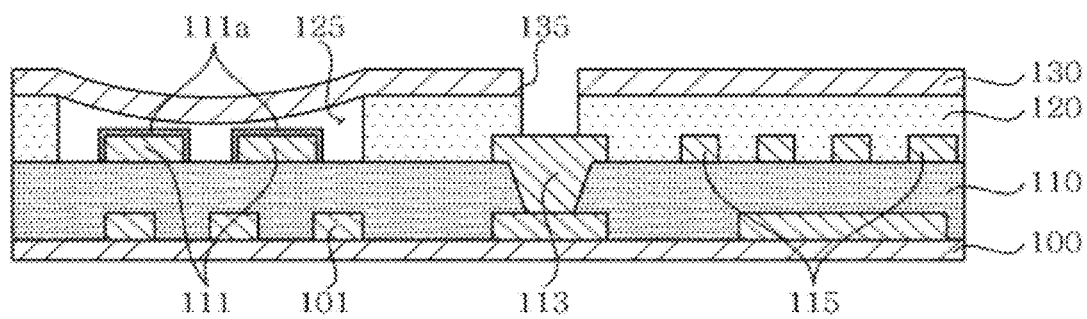

Then, as shown in FIG. 5, a second opening 135 is formed in the protective film 130 and the solder resist layer 120 to expose the second connection pads 113.

Here, the second opening 135 may be formed by using laser, and more specifically, may be formed by, first, disposing a mask (not shown) having patterns for exposing the second connection pads 113 above an upper surface of the protective film 130, and then removing parts of the protective film and the solder resist layer corresponding to the second connection pads 113 by using laser.

Here, the laser may include at least one of $CO_2$ laser, excimer laser, and YAG laser, but is not particularly limited thereto. Here, mechanical drilling may also be used, besides the above laser drilling.

Figure 9:
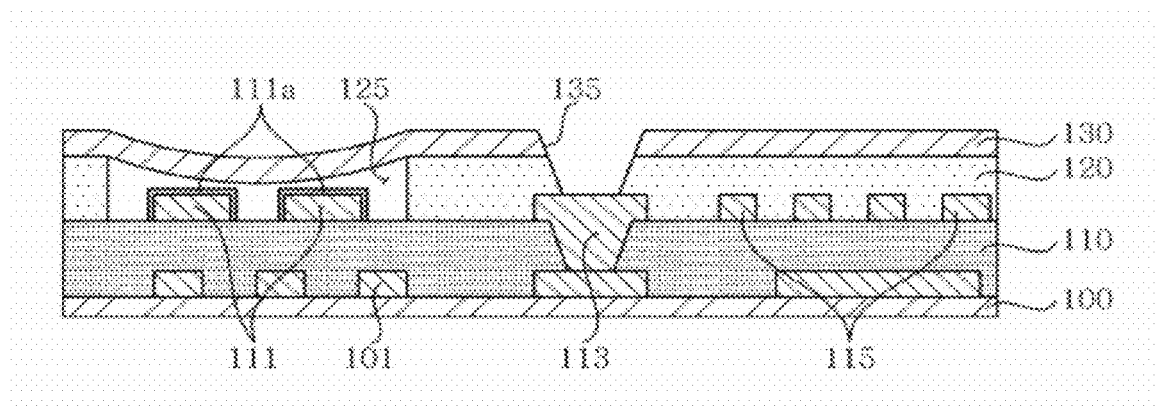
FIGS. 9 and 10 are views showing a second opening formed in a tapered shape according to a preferred embodiment of the present invention.

Further, FIG. 5 shows the second opening 135, of which an upper diameter and a lower diameter have the same size. However, the second opening 135 may be formed in a tapered shape in which a diameter becomes narrower toward the lower end, as shown in FIG. 9.

As such, the second opening 135 is formed by using laser, thereby improving an alignment degree between the second connection pads 113 and the second opening 135. That is, in a case where the second opening 135 is formed by exposing and developing processes, defects might occur due to eccentricity between the second connection pads 113 and the second opening 135. However, in the present preferred embodiment, the second opening 135 is formed more precisely by using laser, and thus, the second connection pads 113 can be formed more minutely and precisely.

Then, post-treatment is performed in order to remove residues due to the above-described laser process. Here, the post-treatment may be performed by wet desmear treatment or dry desmear treatment.

Figure 12:
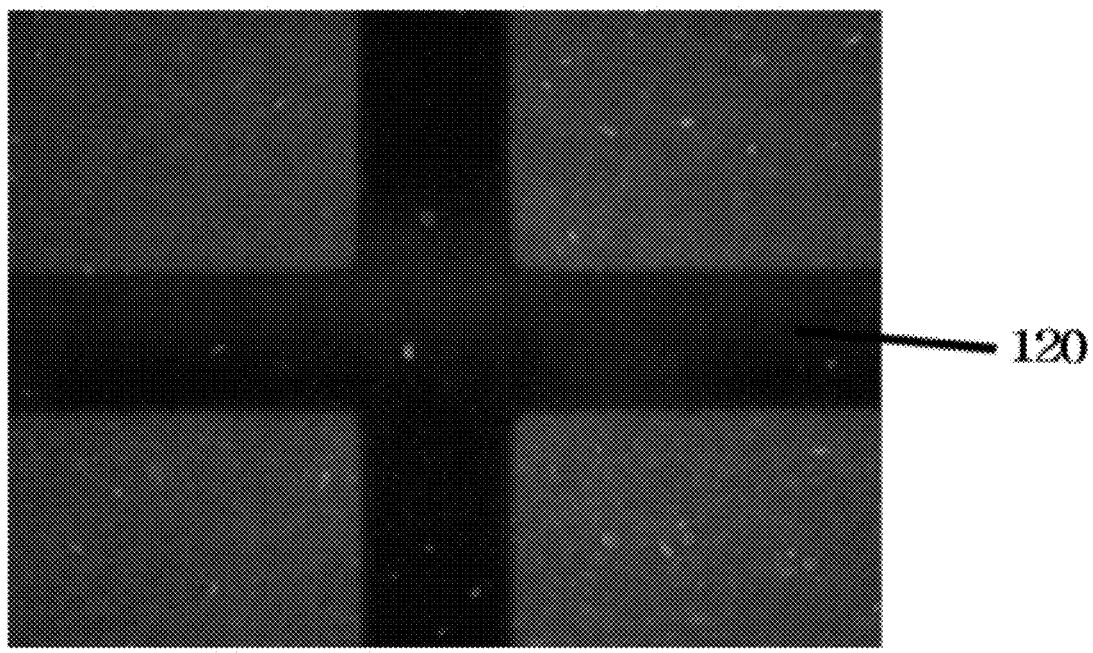
FIG. 12 is a view showing a test result after a desmear process is performed with attachment of a protection film, in the method for manufacturing a printed circuit board according to the preferred embodiment of the present invention.

According to the present preferred embodiment, the protection film 130 can be used to prevent a defect, such as a whitening phenomenon which might occur on a surface of the solder resist layer 120 due to the post-treatment described above with reference to FIG. 12, that is, the desmear process.

Here, the whitening phenomenon refers to a phenomenon in which a surface of the solder resist becomes roughened and partially exhibits white due a chemical reaction of components such as carboxyl groups of the solder resist and desmear chemical components.

Figure 11:
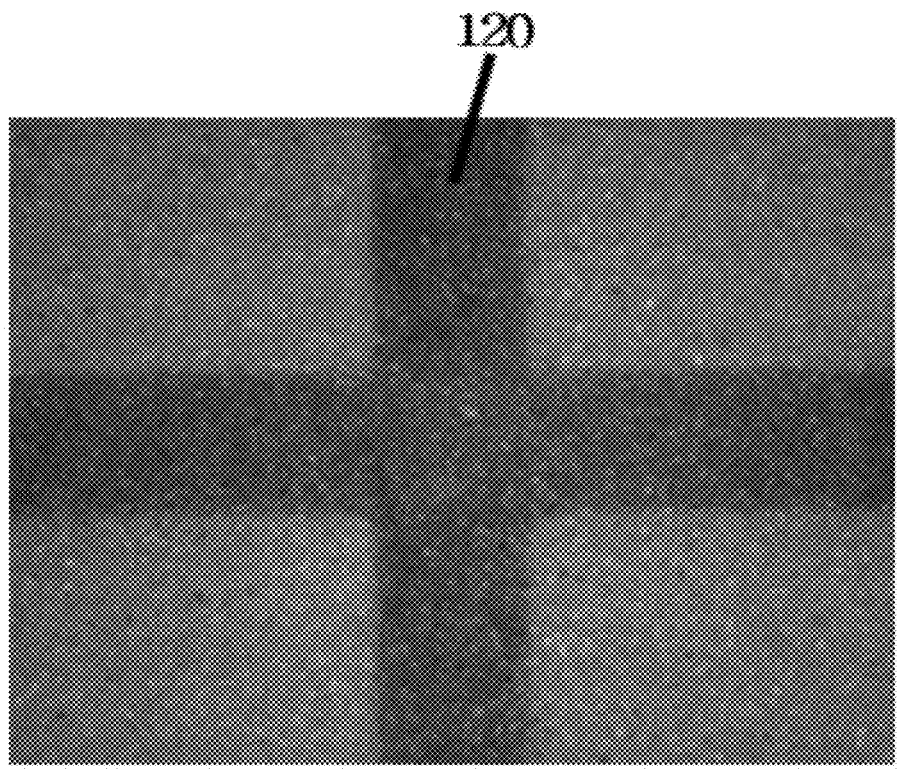
FIG. 11 is a view showing a test result after a desmear process is performed without attachment of a protection film, in the method for manufacturing a printed circuit board according to the preferred embodiment of the present invention.

In other words, when the first surface treatment layer 111a is formed and the second opening 135 is formed by using the laser without attaching the protective film 130 on the solder resist layer 120, and then the desmear process is performed in order to remove smear remaining on the exposed surfaces of the second connection pads 113, the whitening phenomenon, in which the surface of the solder resist layer 120 looks white not green, might occur due to the above-described chemical reaction, as shown in FIG. 11. Here, the above protective film 130 may be employed in the above-described process, thereby preventing a defect such as the whitening phenomenon.

Here, materials having chemical resistance to desmear chemicals, heat resistance (thermal stability) to laser processing, and processing properties similar to those of the solder resist may be used for the protective film 130, and a thermoplastic resin such as PET, polyimide (PI), or the like may be used, but the protective film is not particularly limited thereto.

Figure 6:
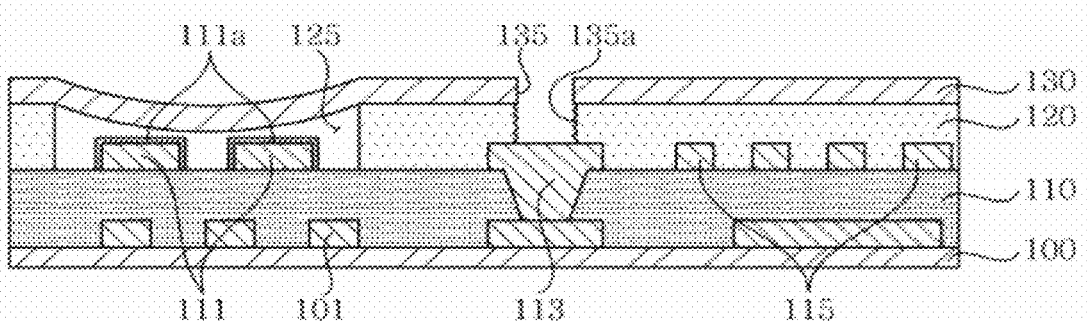

Meanwhile, according to the present preferred embodiment, as the protective film 130 is formed on the solder resist layer 120, and then the laser processing and the desmear process are performed, a whitening phenomenon may not occur on the surface of the solder resist layer 120, as shown in FIG. 6. However, a sidewall of the solder resist layer 120 inside the second opening 135 is opened, and thus, a whitening phenomenon may occur on the sidewall of the solder resist layer 120 inside the second opening 135, due to desmear chemicals.

Specifically, unevenness 135a may be formed on the sidewall of the solder resist layer 120 inside the second opening 135. That is, the sidewall of the solder resist layer 120 inside the second opening 135 is roughened by desmear chemicals.

Here, a rough degree, that is, a roughness of the sidewall of the solder resist layer 120 inside the second opening 135 may be higher than a roughness of an inner sidewall of the first opening 125. The reason is that the protective film 130 formed to cover the first opening 125 prevents desmear chemicals from penetrating inside the first opening 125 at the time of a desmear process.

Further, a light degree, that is, the brightness of the sidewall of the solder resist layer 120 inside the second opening 135 may be higher than the brightness of the inner sidewall of the first opening 125.

Further, the sidewall of the solder resist layer 120 inside the second opening 135 may partially or totally exhibit white but not green.

Figure 13:
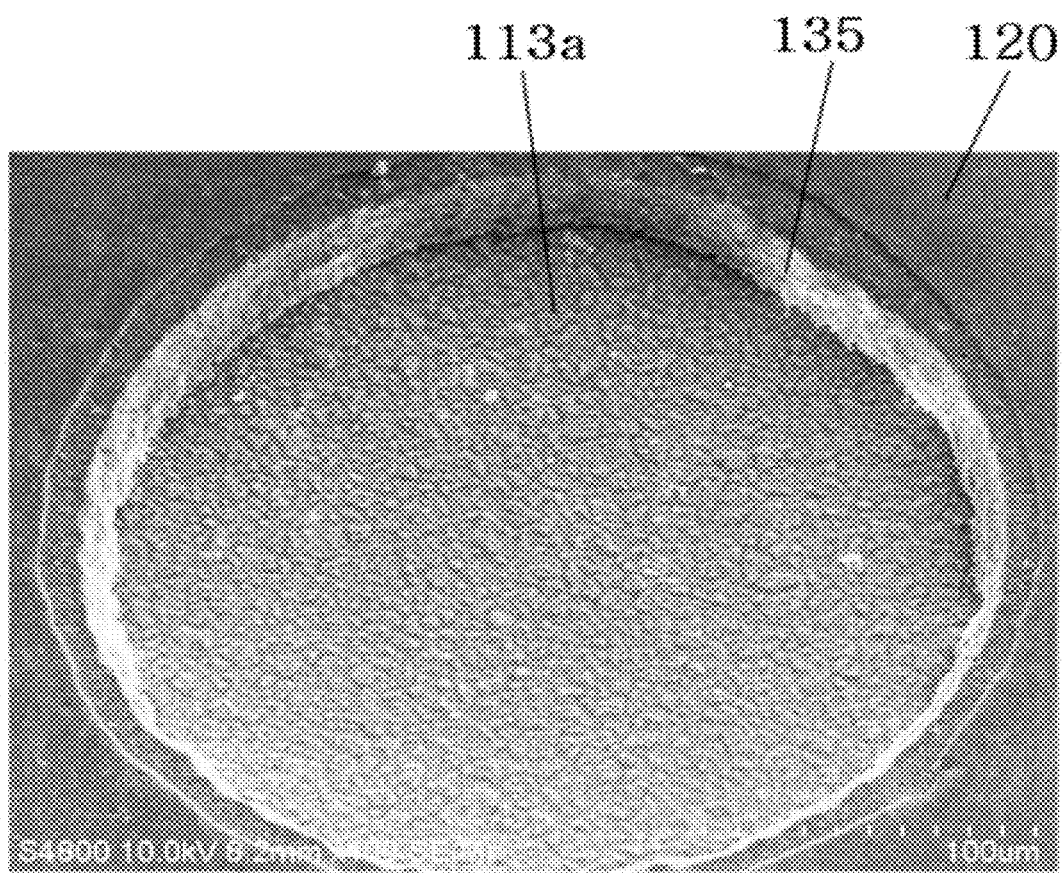
FIG. 13 shows a photograph of the second opening formed according to a preferred embodiment of the present invention.

The shape of the second opening 135 formed according to the present invention is shown in FIG. 13. It can be seen from FIG. 13 that roughness and brightness of the sidewall of the solder resist layer 120 inside the second opening 135 are higher than those of the surface of the solder resist layer 120.

Figure 7:
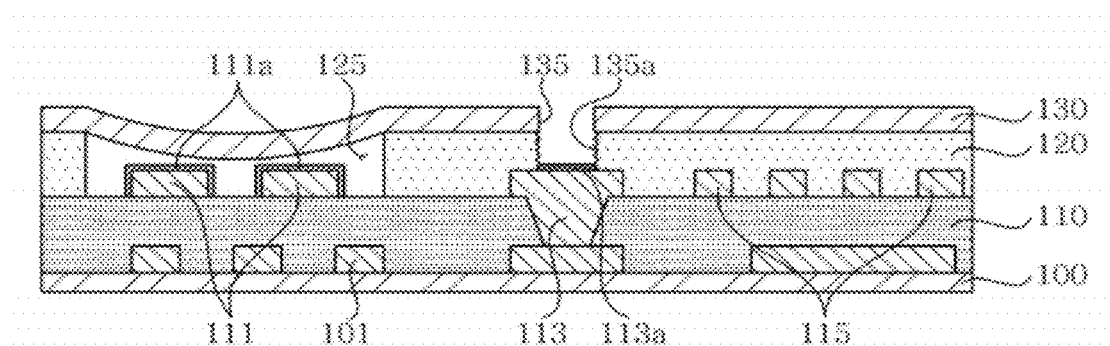

Then, as shown in FIG. 7, the second surface treatment layer 113a is formed on the second connection pads 113 within the second opening 135.

Here, the second surface treatment layer 113a may be formed by at least one of an electrolytic nickel and gold plating type, an electroless nickel immersion gold (ENIG) type, an electroless nickel autocatalytic gold (ENAG) type, an electroless nickel electroless palladium immersion gold (ENEPIG) type, an electroless nickel immersion palladium immersion gold (ENPIG) type, an immersion tin plating type, and an organic solderability preservative (OSP) type. In the present preferred embodiment, the second surface treatment layer 113a may be formed by using the same type as the first surface treatment layer 111a, but may be formed by a different type from the first surface treatment layer 111a according to the needs for various designs.

For example, in the present preferred embodiment, when the first surface treatment layer 111a is formed by using an electroless plating type, the second treatment layer 113a may be formed by coating an organic material to form, for example, an organic solderability preservative (OSP) layer or the like, which has a different material constitution from the first surface treatment layer 111a, on the second connection pads 113.

Figure 8:
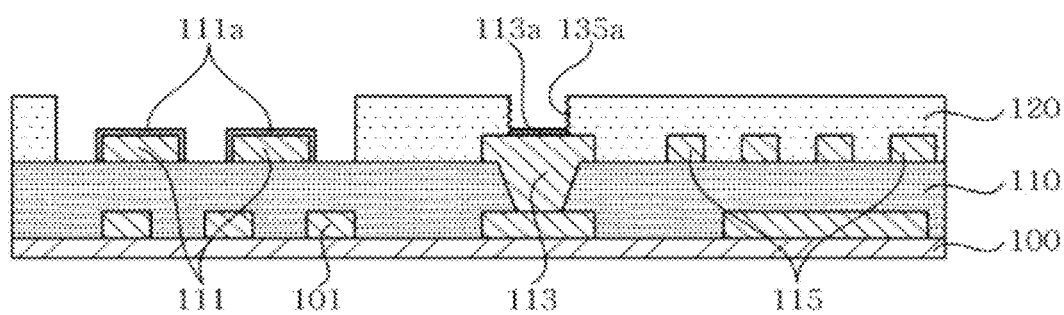

Then, as shown in FIG. 8, the protective film 130 is removed.

The protective film 130 is removed after the second surface treatment layer 113a is formed, in the present preferred embodiment, but it is also possible to remove the protective film 130 after the desmear process shown in FIG. 6, and then form the second surface treatment layer 113a.

The removal of the protective film 130 may be performed by mechanical exfoliation or chemical exfoliation, but is not limited thereto.

Figure 10:
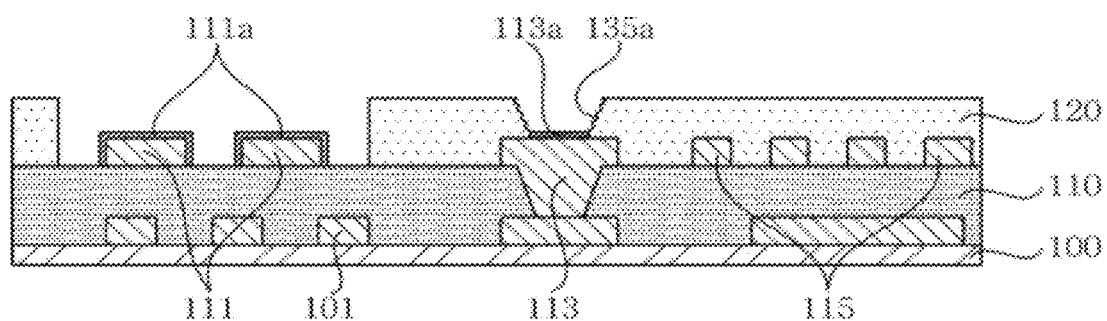

Here, as described above, in the state where the second opening 135 is formed in a tapered shape, the second opening 135 of the solder resist layer 120 may have a tapered shape, as shown in FIG. 10, after the protective film 130 is removed.

As set forth above, according to the present invention, the solder resist layer functions as the plating resist, and thus, a separate process for forming the plating resist is not required.

Therefore, the manufacturing process can be shortened, and the processing cost and the processing time can be reduced.

Further, according to the present invention, since the surface treatment layer is formed by using electroless plating, the removal of the seed layer is performed once, as compared with the prior art where the seed layer is removed twice, in order to form the surface treatment layer. This results in a decrease in the number of etching processes, thereby preventing the circuit patterns from being damaged.

Further, according to the present invention, the desmear process is performed after the protective film is formed on the solder resist layer, thereby preventing the whitening phenomenon from occurring on the surface of the solder resist layer.

Although the preferred embodiments of the present invention have been disclosed for illustrative purposes, they are for specifically explaining the present invention and thus a method for manufacturing a printed circuit board according to the present invention is not limited thereto, but those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A method for manufacturing a printed circuit board, the method comprising the following steps in sequence:
    preparing a base substrate having first connection pads and second connection pads;
    forming a solder resist layer on the base substrate, the solder resist layer having a first opening for exposing the first connection pads;
    forming a first surface treatment layer on the first connection pads;
    forming a protective film on the solder resist layer;
    forming a second opening for exposing the second connection pads in the protective film and the solder resist layer;
    forming a second surface treatment layer on the second connection pads; and
    removing the protective film,
    wherein a sidewall of the solder resist layer inside the second opening has a higher brightness than an inner sidewall of the first opening,
    wherein the first opening of the solder resist layer is formed through exposing and developing processes, and
    wherein the forming of the second opening is conducted by using a laser.

2. The method as set forth in claim 1, wherein the forming of the solder resist layer includes:
    forming the solder resist layer on the base substrate; disposing a mask, which has a pattern for exposing the first connection pads, above an upper surface of the solder resist layer; and
    removing a part of the solder resist, which corresponds to the first connection pads, through exposing and developing processes.

3. The method as set forth in claim 1, wherein the forming of the second opening includes:
    disposing a mask, which has a pattern for exposing the second connection pads, above an upper surface of the protective film; and
    removing parts of the protective film and the solder resist, simultaneously, which correspond to the second connection pads, by using the laser.

4. The method as set forth in claim 3, wherein the laser includes at least one of $CO_2$ laser, excimer laser, and YAG laser.

5. The method as set forth in claim 3, further comprising performing post-treatment for removing residues due to the laser processing after the removing of the protective film and the solder resist.

6. The method as set forth in claim 5, wherein the post-treatment is performed by wet desmear treatment or dry desmear treatment.

7. The method as set forth in claim 1, wherein the first connection pad is a wire bonding pad and the second connection pad is a bump pad.

8. The method as set forth in claim 1, wherein the first surface treatment layer and the second surface treatment layer are formed, respectively, by at least one of an electrolytic nickel and gold plating type, an electroless nickel immersion gold (ENIG) type, an electroless nickel autocatalytic gold (ENAG) type, an electroless nickel electroless palladium immersion gold (ENEPIG) type, an electroless nickel immersion palladium immersion gold (ENPIG) type, an immersion tin plating type, and an organic solderability preservative (OSP) type.

9. The method as set forth in claim 8, wherein the first surface treatment layer and the second surface treatment layer are respectively formed in different types.

10. The method as set forth in claim 9, wherein the first surface treatment layer is formed by any one of the electrolytic nickel and gold plating type, the ENIG type, the ENAG type, the ENEPIG type, the ENPIG type, and the immersion tin plating type, and the second surface treatment layer is formed by the OSP type.

11. The method as set forth in claim 1, wherein the protective film is a PET film or a polyimide (PI) film.

12. The method as set forth in claim 1, wherein the second opening is formed in a tapered shape.

13. The method as set forth in claim 1, wherein an unevenness is formed on a sidewall of the solder resist layer inside the second opening.

14. The method as set forth in claim 1, wherein the sidewall of the solder resist layer inside the second opening has a higher roughness than an inner sidewall of the first opening.

15. A method for manufacturing a printed circuit board, the method comprising the following steps in sequence:
preparing a base substrate having first connection pads and second connection pads;
forming a solder resist layer on the base substrate, the solder resist layer having a first opening for exposing the first connection pads;
forming a first surface treatment layer on the first connection pads;
forming a protective film on the solder resist layer;
forming a second opening for exposing the second connection pads in the protective film and the solder resist layer;
forming a second surface treatment layer on the second connection pads; and
removing the protective film,
wherein the sidewall of the solder resist layer inside the second opening has a higher roughness than an inner sidewall of the first opening.

\* \* \* \* \*